United States Patent
Lumb et al.

(10) Patent No.: US 8,878,161 B2
(45) Date of Patent: Nov. 4, 2014

(54) TUNNEL DIODES INCORPORATING STRAIN-BALANCED, QUANTUM-CONFINED HETEROSTRUCTURES

(71) Applicants: Matthew Lumb, Alexandria, VA (US); Michael K. Yakes, Alexandria, VA (US); María González, Washington, DC (US); Christopher Bailey, Washington, DC (US); Robert J. Walters, Alexandria, VA (US)

(72) Inventors: Matthew Lumb, Alexandria, VA (US); Michael K. Yakes, Alexandria, VA (US); María González, Washington, DC (US); Christopher Bailey, Washington, DC (US); Robert J. Walters, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/198,735

(22) Filed: Mar. 6, 2014

(65) Prior Publication Data

US 2014/0252312 A1 Sep. 11, 2014

Related U.S. Application Data

(60) Provisional application No. 61/773,929, filed on Mar. 7, 2013.

(51) Int. Cl.
*H01L 29/06* (2006.01)
*H01L 29/15* (2006.01)

(52) U.S. Cl.
CPC .................................. *H01L 29/151* (2013.01)
USPC ............................................... 257/14; 438/20

(58) Field of Classification Search
USPC .............................................. 257/14; 438/20
See application file for complete search history.

(56) References Cited

U.S. PATENT DOCUMENTS

| 6,815,736 B2 * | 11/2004 | Mascarenhas ................ 257/201 |
| 7,346,089 B2 * | 3/2008 | Ueki et al. ............... 372/50.124 |
| 2003/0089392 A1 | 5/2003 | Rohr et al. |

OTHER PUBLICATIONS

A. De Vos, "Detailed Balance Limit of the Efficiency of Tandem Solar-Cells," J. Phys. D: Appl. Phys., vol. 13, pp. 839-846 (1980).
F. Dimroth et al., "Wafer bonded four-junction GaInP/GaAs//GaInAsP/GaInAs concetrator solar cells with 44.7% efficiency," Progress in Photovoltaics: Research and Applications, vol. 22, pp. 277-282 (2014).
F. Dimroth, "High-efficiency solar cells from III-V compound semiconductors," Phys. Status Solidi C, vol. 3, pp. 373-379 (2006).
M. P. Lumb, M. K. Yakes, M. Gonzalez, I. Vurgaftman, C. G. Bailey, R. Hoheisel, and R. J. Walters, "Double quantum-well tunnel junctions with high peak tunnel currents and low absorption for InP multi-junction solar cells," Appl. Phys. Let, vol. 100, p. 213907 (2012).

(Continued)

*Primary Examiner* — Jami M Valentine
(74) *Attorney, Agent, or Firm* — US Naval Research Laboratory; Joslyn Barritt

(57) ABSTRACT

A strain-balanced quantum well tunnel junction (SB-QWTJ) device. QW structures are formed from alternating quantum well and barrier layers situated between $n^{++}$ and $p^{++}$ layers in a tunnel junction formed on a substrate. The quantum well layers exhibit a compressive strain with respect to the substrate, while the barrier layers exhibit a tensile strain. The composition and layer thicknesses of the quantum well and barrier layers are configured so that the compressive and tensile strains in the structure are balanced.

6 Claims, 3 Drawing Sheets

(56) References Cited

OTHER PUBLICATIONS

N.J. Ekins-Daukes, K. Kawaguchi, and J. Zhang, "Strain-Balanced Criteria for Multiple Quantum Well Structures and Its Signature in X-ray Rocking Curves," Cryst. Growth Des., vol. 2, pp. 287-292 (2002).

N.J. Ekins-Daukes, K.W.J. Barnham, J.P. Connolly, J.S. Roberts, J.C. Clark, G. Hill, and M. Mazzer, "Strain-balanced GaAsP/InGaAs quantum well solar cells," Appl. Phys. Lett. vol. 75, No. 26, pp. 4195-4197 (1999).

M. P. Lumb, I. Vurgaftman, C. A. Affouda, J. R. Meyer, E. H. Aifer, and R. J. Walters, "Quantum wells and superlattices for III-V photovoltaics and photodetectors," in Proceedings of SPIE, Next Generation (Nano) Photonic and Cell Technologies for Solar Energy Conversion III, San Diego, 2012, p. 84710A.

C. G. Bailey, S. M. Hubbard, D. V. Forbes, and R. P. Raffaelle, "Evaluation of strain balancing layer thickness for InAs/GaAs quantum dot arrays using high resolution x-ray diffraction and photoluminescence," Appl. Phys. Lett., 95, 203110 (2009).

\* cited by examiner

TUNNEL DIODES INCORPORATING STRAIN-BALANCED, QUANTUM-CONFINED HETEROSTRUCTURES

CROSS-REFERENCE

This application is a Nonprovisional of, and claims the benefit of priority under 35 U.S.C. §119 based on, U.S. Provisional Patent Application No. 61/773,929 filed on Mar. 7, 2013, the entirety of which is hereby incorporated by reference into the present application.

TECHNICAL FIELD

The present invention relates to semiconductor diodes, in particular semiconductor diodes that include quantum-confined heterostructures or quantum wells.

BACKGROUND

Multijunction (MJ) solar cells are the state of the art, high efficiency solar cell technology, having theoretical maximum efficiencies of ~63% for a triple junction and ~86% for an infinite series of junctions. See A. De Vos, "Detailed Balance Limit of the Efficiency of Tandem Solar-Cells," *J. Phys. D: Appl. Phys., vol.* 13, pp. 839-846 (1980). MJ solar cells currently hold the highest conversion efficiency recorded, having demonstrated conversion efficiencies above 44.7% under concentrated sunlight. See F. Dimroth et al., "Wafer bonded four-junction GaInP/GaAs//GaInAsP/GaInAs concetrator solar cells with 44.7% efficiency," *Progress in Photovoltaics: Research and Applications, vol.* 22, pp 277-282 (2014).

A conventional, two-terminal monolithic MJ solar cell consists of semiconductor layers grown sequentially on top of each other to form two or more series connected subcells. The subcells absorb incident sunlight and convert the light to electricity, and maximum efficiency is achieved when the band-gaps of the subcell materials split the incident solar spectrum optimally among the subcells.

A major technical challenge for such MJ solar cells lies in growing the multi-layered stack with high crystalline quality, which is extremely important for the efficient conversion of sunlight to electrical power. High crystalline quality is most easily achieved when the materials are grown lattice-matched to the growth substrate. Lattice mismatched growth, whilst enabling greater flexibility in available bandgaps, generally leads to high densities of dislocations and other defects that short the device and/or increase the parasitic loss for the photogenerated carriers.

Tunnel junctions, also known as Esaki diodes, are an important component of MJ solar cells, connecting the subcells of a monolithic MJ stack in electrical series. For optimal performance it is important that the tunnel junction (TJ) has a high enough peak tunnel current density to not impede the flow of photocurrent between the subcells, which can reach tens of $A/cm^2$ in sun-concentrator applications. F. Dimroth, "High-efficiency solar cells from III-V compound semiconductors," *Phys. Status Solidi C, vol.* 3, pp. 373-379 (2006). Also, the differential resistance of the TJ should be as low as possible to minimize any voltage drop across the TJ. A final consideration for solar cell applications is that the TJ should be as transparent as possible to light with energy below the band gap of the cell directly above the TJ, both to minimize the filtering of the light to the cell beneath and also to minimize the possibility of photocurrent being produced by the TJ.

In recent work, a basic $p^{\prime\prime}/n^{++}$ TJ was produced using InAlGaAs material with a bandgap of 1.18 eV for an InP based MJ cell. See M. P. Lumb, M. K. Yakes, M. Gonzalez, I. Vurgaftman, C. G. Bailey, R. Hoheisel, and R. J. Walters, "Double quantum-well tunnel junctions with high peak tunnel currents and low absorption for InP multi-junction solar cells," *Appl. Phys. Lett., vol.* 100, p. 213907 (2012). The bulk TJ was compared to a comparative lattice-matched quantum well tunnel junction (LM-QWTJ) structure, containing a pair of lattice-matched $In_{0.53}Ga_{0.47}As$ quantum wells providing much more efficient interband tunneling. The relative performance of the LM-QWTJ and the bulk TJ were measured, with the QWTJ demonstrating a greater than 45-fold increase in the peak tunnel current and a greater than 15-fold reduction in the differential resistance, with only a small impact on the transparency. This result demonstrates that LM-QWTJs are able to reduce the voltage losses associated with the TJ resistance, without sacrificing the transparency of the TJ which would be compromised using bulk materials of the same bandgap as the QWs. This result is particularly important in high concentration applications where having minimal series resistance plays a crucial role in the power conversion efficiency.

The LM-QWTJ approach has intrinsic design flexibility by tailoring the dimensions and materials employed in the QWs and barriers. However, the tuning range is limited in scope due to the constraints imposed by the condition of lattice matching on the availability of materials with suitable bandgaps. The tunability of the QWTJ can be improved by using lattice mismatched layers, making a much wider choice of bandgaps available on any given substrate.

Incorporating strain into the epitaxial growth can introduce dislocations if the critical thickness for a given epitaxial layer is exceeded, therefore any lattice mismatched layer introduced in to the crystal needs to be within its critical thickness to maintain high material quality. However, the cumulative stress on the crystal from multiple strained layers grown within their critical thickness can also lead to dislocation generation. A proven method to incorporate strained layers into a crystal without a cumulative build-up of stress and hence avoid relaxation is to use strain-balancing, where the compressive strain introduced by a layer with lattice constant larger than the host substrate is balanced by tensile strain from a layer with a lattice constant smaller than the host. See N. J. Ekins-Daukes, K. Kawaguchi, and J. Zhang, "Strain-Balanced Criteria for Multiple Quantum Well Structures and Its Signature in X-ray Rocking Curves," *Cryst. Growth Des., vol.* 2, pp. 287-292 (2002).

For example, strain-balancing has been used in solar cells incorporating multiple quantum well (MQW) structures into the intrinsic region of a p-i-n or n-i-p diode, where a compressive strain caused by use of a lattice-mismatched material in a quantum well situated between n- and p-type layers is balanced by a tensile strain in the barrier layers of the structure. See N. J. Ekins-Daukes, K. W. J. Barnham, J. P. Connolly, J. S. Roberts, J. C. Clark, G. Hill, and M. Mazzer, "Strain-balanced GaAsP/InGaAs quantum well solar cells," *Appl. Phys. Lett. Vol.* 75, No. 26, pp. 4195-4197 (1999); and U.S. Patent Application Publication No. 2003/0089392 "Photovoltaic Device." Strain balancing is used in such structures to enable many periods of the well/barrier system to be grown without degrading the crystal quality of subsequent layers. In these devices the QWs are used as absorbers, the bandgap of which can be tuned using the compositions and thicknesses of the QW/barrier system. The MQW structure is grown unintentionally doped, and carrier transport across the region is mediated by drift transport from the built-in electric field of the diode.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a semiconductor device comprising at least one strain-balanced quantum well tunnel junction, in which a compressive strain in one part of the device is balanced by a tensile strain in another so that the overall structure of the device is strain-balanced.

A semiconductor device in accordance with the present invention includes at least one quantum well tunnel junction disposed on a substrate, where the tunnel junction comprises an n-type doped quantum well layer disposed between first and second n-type doped barrier layers and a p-type quantum well layer disposed between first and second p-type doped barrier layers, with an n-type barrier layer being adjacent a p-type barrier layer. In some embodiments, at least one of the n- and the p-type quantum well layers experiences a compressive strain with respect to the substrate and at least one of the n- and p-type barrier layers experiences a tensile strain with respect to the substrate, while in other embodiments, at least one of the n- and the p-type quantum well layers experiences a tensile strain with respect to the substrate and at least one of the n- and p-type barrier layers experiences a compressive strain with respect to the substrate. In both embodiments, at least one of a material composition and a thickness of the quantum well layers and the barrier layers are configured so that the compressive strain and the tensile strain are balanced.

In an exemplary embodiment, the structure includes two $In_{0.65}Ga_{0.35}As$ quantum wells on an InP substrate, each grown with a thickness not exceeding the critical thickness of the material on InP. The $In_{0.65}Ga_{0.35}As$ quantum wells have a larger lattice constant than InP and so exhibit a compressive strain with respect to the substrate. To balance this compressive strain, in accordance with the present invention, the structure further includes tensile-strained $In_{0.41}Al_{0.59}As$ barrier layers on either side of each QW, where each individual barrier layer is also grown with a thickness not exceeding the critical thickness for this material on InP. The composition and layer thickness of each of the QWs and barrier layers are configured to achieve overall strain balance.

Thus, by configuring the composition and/or thickness of the quantum well layers and barrier layers, a strain-balanced structure having a desired bandgap or other performance criteria can be grown. The use of strain-balancing to enlarge the range of available compositions for well and barrier materials enables bandgaps and/or band alignments to be targeted which are not available using lattice matched materials alone. Therefore, structures can be designed to optimize particular performance aspects of the device, such as maximizing the probability of elastic tunneling across the TJ or minimizing the optical absorption in the wells, without degrading the crystal quality of the material.

DETAILED DESCRIPTION

Figure 1:
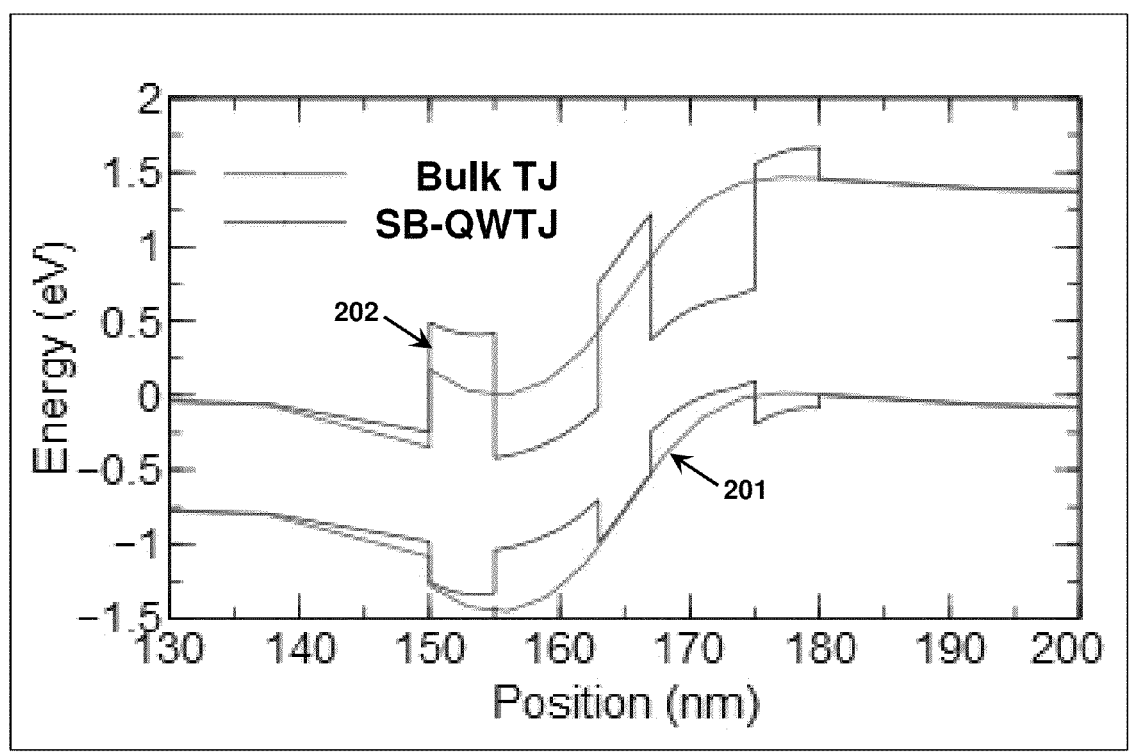
FIG. 1 presents plots showing equilibrium energy band diagrams of a conventional bulk tunnel junction and a strain-balanced quantum well tunnel junction in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

Achieving a tunnel junction with high peak tunneling current and low differential resistance requires a high tunneling probability across the forbidden region between the conduction band and the valence band of the $n^{++}$ and $p^{++}$ type layers respectively. This requires very high doping concentrations to achieve degeneracy and efficient tunneling can be difficult to achieve, especially in wide-bandgap materials where the potential energy barrier is large. In a quantum well tunnel junction (QWTJ), incorporating quantum wells in the junction region introduces states into the forbidden region which dramatically increase the probability of tunneling. This enables significant improvements in TJ performance over bulk TJs with equivalent doping densities and has only a small effect on the transparency of the device.

A QWTJ comprises one or more highly doped quantum wells surrounded by highly doped barrier layers of wider bandgap, situated between highly doped $n^{++}$ and $p^{++}$ bulk layers, and differs from a conventional MQW solar cell device both in its structure and in its operation.

In a conventional MQW solar cell device, the quantum wells are situated in an unintentionally doped region surrounded by much lower doped n- and p-type bulk layers. Photogenerated carriers within the quantum wells are swept out of the MQW region by the built-in field of the device. Unlike the QWTJ, no interband tunneling occurs in the MQW solar cell due to the lower doping levels and smaller electric field of the MQW solar cell device compared to the QWTJ.

In contrast, in a QWTJ, the QWs are highly doped to maintain a very large electric field across the tunnel junction and are positioned to give a large probability for majority carriers to tunnel from one side of the device to the other.

The QWs are formed from very thin, typically less than about 20 nm, layers of materials having a narrower bandgap than the materials forming the barrier layers, and improve the tunnel performance of the diode by an efficient tunneling mechanism between the conduction and valence bands via the states in the quantum wells. However, as noted above, the constraint of lattice-matched epitaxy limits the number of available bandgaps and therefore reduces the number of possible configurations with suitable band alignments to realize effective QW/barrier systems. Much greater design flexibility can be achieved by incorporating lattice mismatched layers, but doing so also introduces strain into the structure which can compromise the quality of the material grown above the TJ.

The present invention solves this problem by providing a QWTJ structure comprising one or more quantum wells in which the material compositions and thicknesses of the QW and barrier layers in the QWTJs are configured so that parts of the structure having a compressive strain relative to the substrate are compensated by other parts of the structure having a tensile strain relative to the substrate so that the overall strain in the structure is balanced. In most cases, it will be the QWs that are compressively strained, with the strain being balanced by tensile strain in the barrier layers. However, it may be possible to choose materials for the QW that are tensile strained with respect to the substrate, and in such cases, the strain exhibited by the QWs can be balanced by using materials for the barrier layers that are configured to provide a corresponding compressive strain. Each individual layer of the device is configured such that the layer thickness is within the critical thickness for dislocation formation for that material when grown on the particular substrate, and the strain-balancing technique prevents the formation of dislocations through the cumulative build-up of strain due to multiple strained layers in the structure.

For example, for a structure based on an InP substrate, the minimum lattice-matched quantum well material is $In_{0.53}Ga_{0.47}As$, with a room temperature bandgap of 0.74 eV. However, much narrower bandgaps can be achieved using indium compositions greater than 53% and has the potential to enable larger tunneling probabilities. InP-based materials are emerging as important candidates for high efficiency solar cells for high concentration applications and therefore producing extremely high performance tunnel junctions is an important milestone in InP-based research and development.

Strain balancing in accordance with the present invention overcomes these limitations and permits the use of a wide range of bandgap combinations without reducing the crystal quality of the device. This approach can facilitate the overgrowth a subcell on the QWTJ without reducing the power conversion efficiency of the subcell through the introduction of defects. The improved design flexibility affords the SB-QWTJ in accordance with the present invention the potential to out-perform both lattice-matched bulk tunnel diodes and lattice-matched QWTJs by enabling the QW bandgaps to be tailored to maximize the device performance.

EXAMPLES

To demonstrate the advantages of an $n^{++}/p^{++}$ SB-QWTJ semiconductor device in accordance with the present invention over a conventional bulk $n^{++}/p^{++}$ tunnel junction (TJ) device, the inventors herein grew two samples based on the InAlGaAs quaternary system on n-type InP substrates, using by Molecular Beam Epitaxy. As would be understood by one skilled in the art, these structures are merely exemplary, and, as described further below, other materials, doping, and layer thicknesses may be used in an SB-QWTJ structure in accordance with the present invention.

The device structures of the exemplary SB-QWTJ sample in accordance with the present invention and the bulk InAlAs TJ control sample in accordance with the prior art are summarized in Table 1 below.

TABLE 1

| Bulk TJ Control Sample | Thickness (Å) | Dopant | Conc. (cm$^{-3}$) |
| --- | --- | --- | --- |
| $In_{0.53}Ga_{0.47}As$ | 250 | Be | $1 \times 10^{19}$ |
| $In_{0.52}Al_{0.48}As$ | 1500 | Be | $2 \times 10^{17}$ |
| $In_{0.52}Al_{0.48}As$ | 150 | Be | $1 \times 10^{19}$ |
| $In_{0.52}Al_{0.48}As$ | 150 | Si | $1 \times 10^{19}$ |
| $In_{0.53}Ga_{0.47}As$ | 1500 | Si | $2 \times 10^{17}$ |

| SB-QWTJ Sample | Thickness (Å) | Dopant | Conc. (cm$^{-3}$) |
| --- | --- | --- | --- |
| $In_{0.53}Ga_{0.47}As$ | 250 | Be | $1 \times 10^{19}$ |
| $In_{0.52}Al_{0.48}As$ | 1500 | Be | $2 \times 10^{17}$ |
| $In_{0.41}Al_{0.59}As$ | 50 | Be | $8 \times 10^{18}$ |
| $In_{0.65}Ga_{0.35}As$ | 80 | Be | $1.2 \times 10^{19}$ |
| $In_{0.41}Al_{0.59}As$ | 20 | Be | $8 \times 10^{18}$ |
| $In_{0.41}Al_{0.59}As$ | 20 | Si | $8 \times 10^{18}$ |
| $In_{0.65}Ga_{0.35}As$ | 80 | Si | $1.2 \times 10^{19}$ |
| $In_{0.41}Al_{0.59}As$ | 50 | Si | $8 \times 10^{18}$ |
| $In_{0.53}Ga_{0.47}As$ | 1500 | Si | $2 \times 10^{17}$ |

The bulk TJ control sample and the SB-QWTJ sample were grown under nearly identical conditions, except for a correction in the doping profile of the SB-QWTJ to account for the different growth rates of the strained layers versus the lattice-matched layers, with the doping concentrations in the two samples being identical overall. The samples were then processed into circular 0.5 mm diameter metal covered diodes using standard lithography techniques.

As can be seen from Table 1, each of the two samples had a 1500 Å thick n-type Si-doped ($n=2\times10^{17}$ cm$^{-3}$) $In_{0.53}Ga_{0.47}As$ buffer layer below the tunnel junction and had a 1500 Å thick p-type Be-doped ($n=2\times10^{17}$ cm$^{-3}$) $In_{52}Al_{0.47}As$ buffer layer with a 250 Å thick highly doped InGaAs cap above it. The bulk TJ control sample had a single tunnel diode comprising two 150 Å thick highly doped ($n=2\times10^{19}$ cm$^{-3}$) $In_{0.52}Al_{0.48}As$ n- and p-type layers between the buffer layers, while the SB-QWTJ sample had two 80 Å n- and p-type $In_{0.65}Ga_{0.35}As$ QWs between corresponding buffer layers.

The $In_{0.52}Al_{0.48}As$ in the bulk TJ control sample is lattice-matched to InP, and so does not exhibit any strain with respect to the substrate. In contrast, the $In_{0.65}Ga_{0.35}As$ QW material has a larger lattice constant than does the InP substrate. As a result the QW layers are compressively strained with respect to the InP host and $In_{0.65}Ga_{0.35}As$ therefore would ordinarily not be considered to be a good material for an InP-based structure.

In accordance with the present invention, however, the $In_{0.65}Ga_{0.35}As$ QWs are situated between corresponding n- and p-type barrier layers formed from $In_{0.41}Al_{0.59}As$, which has a lattice constant smaller than that of InP. As a result of their smaller lattice constant, the barrier layers are tensile strained with respect to the substrate, and this tensile strain compensates the compressive strain from the QWs resulting from their larger constant. The extent of the compressive strain of the $In_xGa_{1-x}As$ QWs and the tensile strain of the $In_yAl_{1-y}As$ barrier layers is affected by their composition and layer thickness, and therefore, in accordance with the invention, the overall strain in the QWTJ structure can be balanced by appropriately configuring the composition and/or layer thickness of the QW and barrier layers.

The strain-balance approach in accordance with the present invention thus allows narrow-gap well materials to be grown with strain compensation in the barrier layers maintaining crystal quality. Such strain balancing provides great flexibility in selection of materials used for QWTJs. The probability of tunneling across the forbidden region is highly sensitive to the bandgap of the tunnel materials used, and therefore the improved flexibility in the choice of materials made possible by the strain-balanced approach of the present invention provides greater scope for optimizing the performance of TJ devices.

The equilibrium band diagrams of these structures were calculated using NRL Multibands® software, see M. P. Lumb, I. Vurgaftman, C. A. Affouda, J. R. Meyer, E. H. Aifer, and R. J. Walters, "Quantum wells and superlattices for III-V photovoltaics and photodetectors," in *Proceedings of SPIE, Next Generation (Nano) Photonic and Cell Technologies for Solar Energy Conversion III*, San Diego, 2012, p. 84710 A, and the results of those calculations are shown in the plots in FIG. 1.

In FIG. 1, plot 101 shows the equilibrium band structure of a typical lattice-matched, bulk InAlAs tunnel junction, while plot 102 shows the band structure for an InAlAs/InGaAs strain-balanced QWTJ in accordance with the present invention. The SB-QWTJ device contains two QWs which provide an improved probability of tunneling through the conduction band well of one well to the valence band well of the other. The thickness of the $In_{0.41}Al_{0.59}As$ barriers are designed to balance the strain introduced by the $In_{0.65}Ga_{0.35}As$ wells, and the barriers have a wider bandgap than the lattice-matched $In_{0.52}Al_{0.48}As$ bulk material in the lattice matched TJ.

Figure 2:
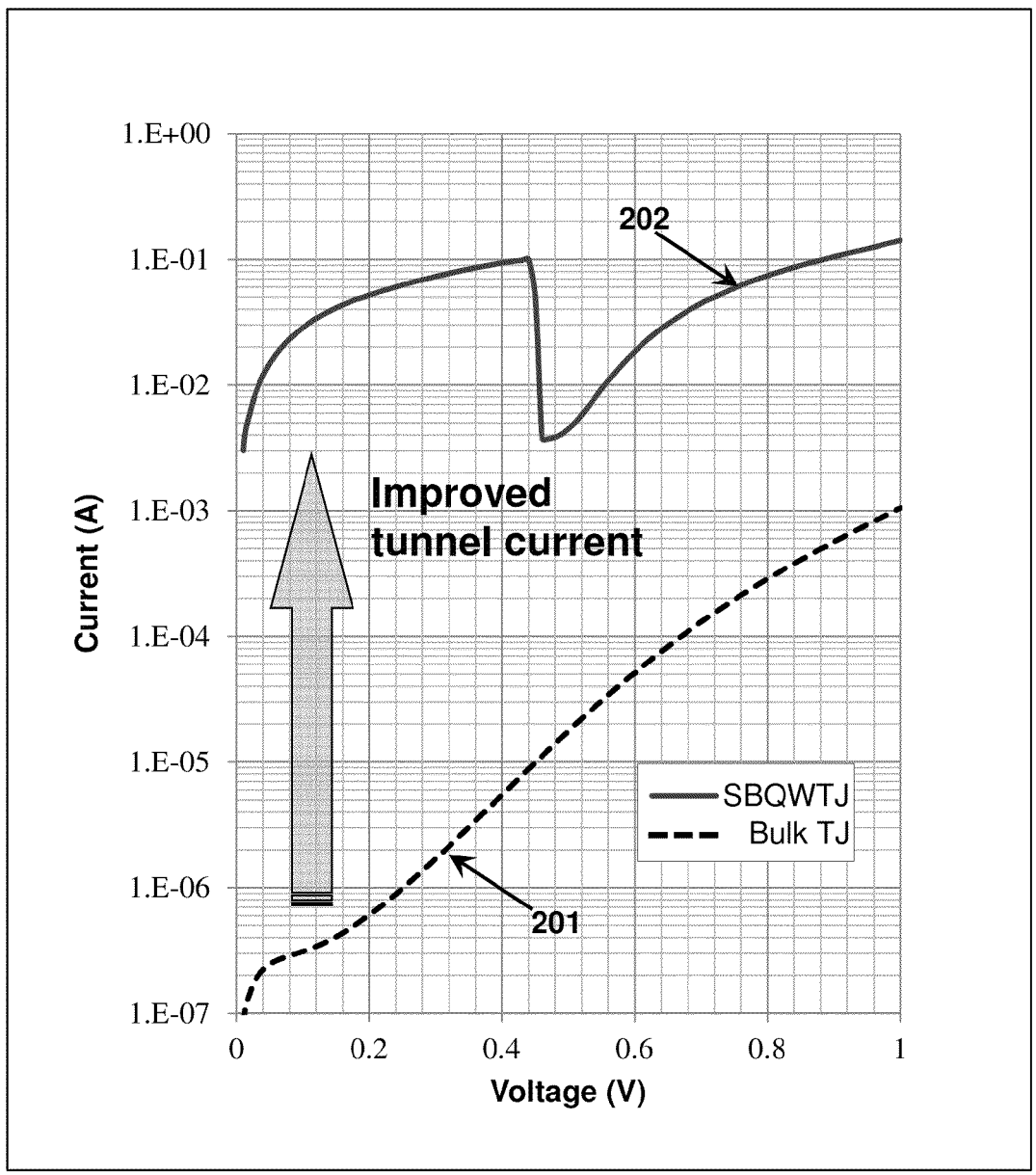
FIG. 2 presents plots showing current as a function of applied voltage for a conventional bulk tunnel junction and a strain-balanced quantum well tunnel junction with identical doping concentrations in accordance with the present invention.

FIG. 2 shows semi-log plots of the measured current-voltage characteristics for exemplary SB-QWTJ device having the structure shown in Table 1 (plot 202) compared to the lattice-matched bulk InAlAs control structure (plot 201). As can be readily seen from the plots, the SB-QWTJ device shows a dramatic increase in performance over the bulk device. For example, the control sample does not exhibit a clear negative differential resistance region and has a differential resistance of 10.0 $\Omega cm^2$. In comparison, the SB-QWTJ performs very effectively as a tunnel diode, with a peak tunneling current of 12.6 $A/cm^2$ and a differential resistance of $2.0 \times 10^{-4}$ $\Omega cm^2$, a four order of magnitude improvement over the control differential resistance.

The plots in FIGS. 1 and 2 illustrate the advantages achieved by the SB-QWTJ structure of the present invention over the conventional bulk TJ structure. The performance of a tunnel junction is a sensitive function of the doping concentration in the TJ layers, and thus the effective doping concentration in these structures was nominally identical to within experimental tolerances, allowing a fair comparison between the devices. The bandgap engineering provided by the SB-QWTJ approach therefore enabled an ultra-high performance TJ to be realized relative to the baseline device which showed almost no tunneling behavior. The large improvement is due to the efficient tunneling pathway between the conduction band of the n-type QW and the valence band of the p-type QW.

In addition, the exemplary SB-QWTJ of the present invention exhibits improved performance over that observed for the InAlGaAs/InGaAs lattice-matched quantum well tunnel junction (LM-QWTJ) previously investigated. See M. P. Lumb, M. K. Yakes, M. Gonzalez, I. Vurgaftman, C. G. Bailey, R. Hoheisel, and R. J. Walters, "Double quantum-well tunnel junctions with high peak tunnel currents and low absorption for InP multi-junction solar cells," *Appl. Phys. Lett.*, vol. 100, p. 213907, 2012. For example, the exemplary SB-QWTJ described herein also exhibited a low excess current and consequently a significantly improved peak-to-valley ratio as compared to the InAlGaAs/InGaAs LM-QWTJ, with the SB-QWTJ exhibiting a peak-to-valley ratio of 26 as compared to the ratio of 13.5 exhibited by the LM-QWTJ. The improved peak-to-valley ratio is attributed to the reduction in trap-assisted excess current in the wide bandgap $In_{0.41}Al_{0.59}As$ barriers in the SB-QWTJ.

Thus, the SB-QWTJ structure in accordance with the present invention has been shown to dramatically improve the device performance relative to a baseline bulk TJ and gives the potential for MJ solar cells with reduced resistive losses and therefore higher efficiencies, particularly at high solar concentration values where photocurrents can be very large. The key advantage of the present invention is that by using a strain-balanced quantum well/barrier system, we can substantially increase the design flexibility of the device. The strain-balanced approach allows the QWTJ technology to be employed in a wider range of materials where lattice-matched III-V materials with the right bandgaps do not exist. The bandgap of the QWs can be controlled through the material thickness and composition, and the barrier thicknesses and composition controlled to ensure the structure is strain-balanced. Therefore, the SB-QWTJ gives the potential for ultra-low differential resistance TJs with high crystal quality in a wide range of material systems where lattice-matched and bulk materials cannot. This allows QWTJs with tailored properties to be realized which can optimize the tunneling performance and optical transparency in a particular solar cell configuration.

Figure 3:
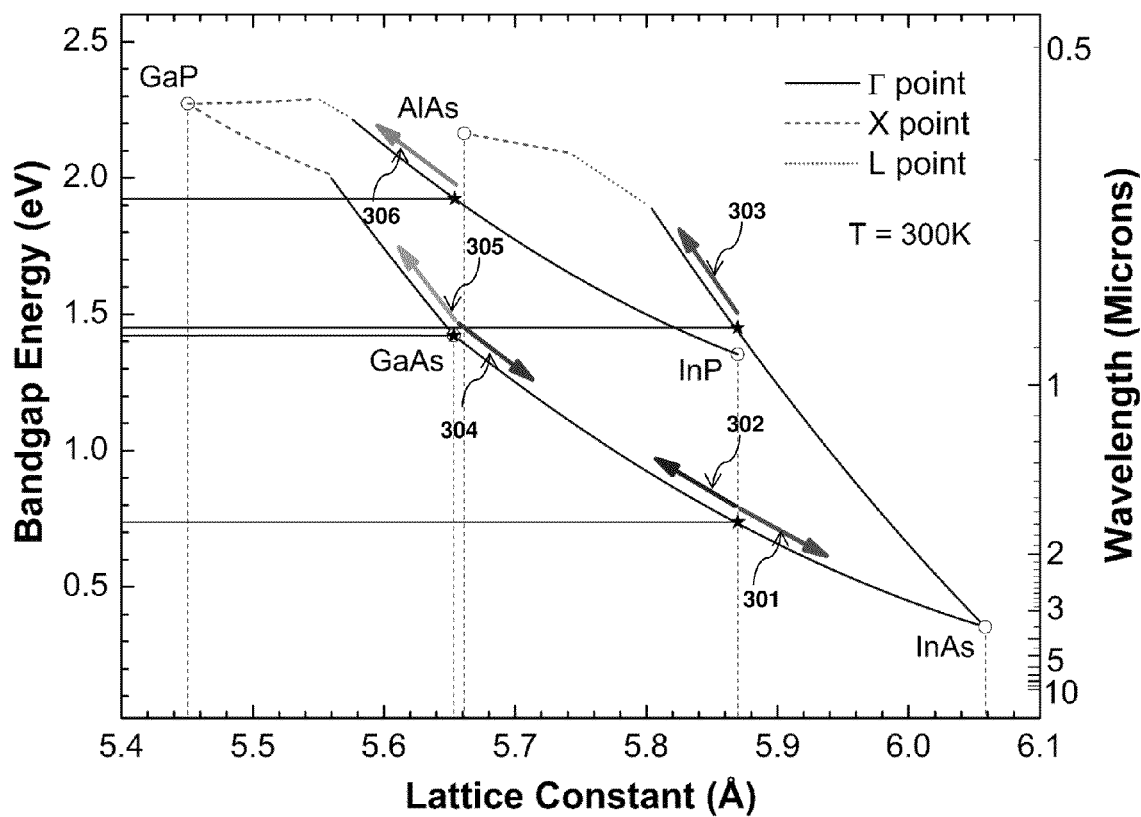
FIG. 3 presents plots of bandgap energy versus lattice constant for various III-V materials that can be used for a strain-balanced quantum well tunnel junction in accordance with the present invention.

FIG. 3 shows the bandgap versus lattice constant curves for some example III-V materials grown on commonly used solar cell substrates, GaAs and InP. Considering only commonly grown III-V materials consisting of As, P or Sb group V elements, the lowest bandgap lattice-matched material on InP is $In_{0.53}Ga_{0.47}As$, with a bandgap of 0.74 eV. The arrows denote the directions for compressive and tensile strain which can be used to make strain-balanced QW structures which extend the available bandgap range over LM-QWTJs. Narrower gap InGaAs QWs can be formed using compressively strained InGaAs over a wide range of bandgaps (arrow 301) and strain balanced using either tensile strained InGaAs (arrow 302) or InAlAs (arrow 303). Similarly, the lowest bandgap material on GaAs is GaAs itself, with a bandgap of 1.42 eV. Narrow gap, compressively strained InGaAs (arrow 304) QWs can be formed on GaAs, with tensile strained GaAsP (arrow 305) or InGaP (arrow 306) barriers. These strain-balanced systems extend the range of available bandgaps for the QWTJ layers, whilst maintaining the high crystal quality required for the growth of high-efficiency MJ cells.

In addition to the materials considered in FIG. 3, more unconventional materials systems such as N- or Bi-containing alloys can be used to achieve other bandgap ranges. Whilst such materials are relatively uncommon in epitaxially grown TJs, their use can theoretically expand the available bandgaps over a limited energy range whilst remaining LM to a given substrate. However, the strain-balancing technique is equally applicable to these alloys to further expand the additional range of bandgaps available, above and beyond the range afforded by LM materials.

Alternatives:

Many variations on the structural parameters of the embodiment specified in FIG. 1 are possible while maintaining the new features and spirit of the invention. The technology can be applied to materials grown on a wide range of substrates, including, but not limited to, III-V substrates such as GaAs, InP, GaSb and InAs, but also group IV substrates such as Si and Ge. The concept could also be used in conjunction with a virtual substrate technology such as a graded buffer layer used in metamorphic solar cells.

The embodiment represented here contains two QWs, but this is not a strict requirement and more or fewer QWs could be added. Also, it is not a necessity that all the layers in the well/barrier system are strained, all that is required is the total QW/barrier system has a net balance of strain. Our example also has QWs of identical composition and barriers of identical composition. However, this is also not a strict requirement and an alternative structure could have asymmetric well/barrier configurations where one or more of the barriers or wells have differing composition.

The final alternative is to use quantum confined heterostructures other than QWs for bandgap engineering of the tunnel junction. Quantum dots or quantum wires could be used to tune the bandgap in a similar way to QWs and can also be strain balanced to maintain high crystal quality. See C. G. Bailey, S. M. Hubbard, D. V. Forbes, and R. P. Raffaelle, "Evaluation of strain balancing layer thickness for InAs/GaAs quantum dot arrays using high resolution x-ray diffraction and photoluminescence," *Appl. Phys. Lett.*, 95, 203110 (2009).

In any case, although particular embodiments, aspects, and features have been described and illustrated, one skilled in the art will readily recognize that the invention described herein is not limited to only those embodiments, aspects, and features, but encompasses modifications to those embodiments, aspects, and features, and the present disclosure encompasses any and all such modifications as being within the spirit and scope of the underlying invention described and claimed herein.

What is claimed is:

1. A strain-balanced quantum well tunnel junction device, comprising:
    a quantum well tunnel junction (QWTJ) situated between $n^{++}$ and $p^{++}$ layers on a substrate;
    the QWTJ comprising an n-type quantum well structure adjacent a p-type quantum well structure, the n-type quantum well structure comprising an n-type quantum well layer disposed between corresponding n-type barrier layers and the p-type quantum well structure comprising a p-type quantum well layer disposed between corresponding p-type barrier layers, an n-type barrier layer being adjacent a p-type barrier layer;
    wherein at least one of the n- and p-type quantum well layers exhibits a first strain with respect to the substrate and at least one of the corresponding n- and p-type barrier layers exhibits a second strain with respect to the substrate;
    wherein at least one of a composition and a thickness of the quantum well layers and the barrier layers is configured to balance a net strain in the device.

2. The SB-QWTJ device according to claim 1, wherein the at least one quantum well layer exhibits a compressive strain with respect to the substrate and the at least one corresponding barrier layer exhibits a tensile strain with respect to the substrate, wherein the quantum well layer and the barrier layer are configured so that the tensile strain in the barrier layer balances the compressive strain in the device.

3. The SB-QWTJ device according to claim 1, wherein the substrate is one of GaAs, InP, GaSb, InAs, Si and Ge.

4. The SB-QWTJ device according to claim 1,
    wherein the substrate comprises InP;
    wherein the QWTJ structure comprises an n-type $In_xGa_{1-x}As$ quantum well layer disposed between corresponding n-type $In_yAl_{1-y}As$ barrier layers and a p-type $In_xGa_{1-x}As$ quantum well layer disposed between corresponding p-type $In_yAl_{1-y}As$ barrier layers, an n-type $In_yAl_{1-y}As$ barrier layer being adjacent a p-type $In_yAl_{1-y}As$ barrier layer;
    wherein at least one of the $In_xGa_{1-x}As$ layers exhibits a compressive strain with respect to the InP substrate and at least one of the $In_yAl_{1-y}As$ layers exhibits a tensile strain with respect to the InP substrate; and
    wherein at least one of the composition and the thickness of the $In_xGa_{1-x}As$ and $In_yAl_{1-y}As$ layers is configured so that the compressive and tensile strains are balanced in the device.

5. The SB-QWTJ device according to claim 1,
    wherein the substrate comprises InP;
    wherein the QWTJ structure comprises an 80 Å n-type $In_{0.65}Ga_{0.35}As$ quantum well layer disposed between a 50 Å first n-type $In_{0.41}Al_{0.59}As$ and a 20 Å second n-type $In_{0.41}Al_{0.59}As$ barrier layer, and further comprises an 80 Å p-type $In_{0.65}Ga_{0.35}As$ quantum well layer disposed between a 20 Å first p-type $In_{0.41}Al_{0.59}As$ and a 50 Å second p-type $In_{0.41}Al_{0.59}As$ barrier layer, the second n-type $In_{0.41}Al_{0.59}As$ barrier layer being adjacent the first p-type $In_{0.41}Al_{0.59}As$ barrier layer;
    wherein at least one of the n- and p-type $In_{0.41}Al_{0.59}As$ quantum well layers exhibits a compressive strain with respect to the InP substrate and at least one of the n- and p-type $In_{0.41}Al_{0.59}As$ barrier layer exhibits a tensile strain with respect to the InP substrate; and
    wherein the $In_{0.41}Al_{0.59}As$ quantum well layers and the $In_{0.41}Al_{0.59}As$ barrier layers are configured so that the compressive and tensile strains are balanced in the device.

6. The SB-QWTJ device according to claim 1, wherein the substrate comprises InP, the at least one quantum well layer being configured to exhibit a compressive strain with respect to the InP substrate and the at least one corresponding barrier layer being configured to exhibit a tensile strain with respect to the InP substrate; wherein at least one quantum well layer and the at least one corresponding barrier layer are configured so that the compressive strain and the tensile strain are balanced in the device.

* * * * *